United States Patent
Asano et al.

(10) Patent No.: US 9,662,763 B2
(45) Date of Patent: May 30, 2017

(54) POLISHING COMPOSITION

(75) Inventors: Hiroshi Asano, Kiyosu (JP); Kazusei Tamai, Kiyosu (JP); Yasunori Okada, Kiyosu (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 60 days.

(21) Appl. No.: 14/000,319

(22) PCT Filed: Feb. 20, 2012

(86) PCT No.: PCT/JP2012/053920
§ 371 (c)(1),
(2), (4) Date: Aug. 19, 2013

(87) PCT Pub. No.: WO2012/115020
PCT Pub. Date: Aug. 30, 2012

(65) Prior Publication Data
US 2013/0324015 A1     Dec. 5, 2013

(30) Foreign Application Priority Data

Feb. 21, 2011    (JP) ................................ 2011-034801

(51) Int. Cl.
*B24B 37/04*     (2012.01)
*C09K 3/14*      (2006.01)
*H01L 21/02*     (2006.01)
*C09G 1/02*      (2006.01)

(52) U.S. Cl.
CPC .............. *B24B 37/044* (2013.01); *C09G 1/02* (2013.01); *C09K 3/1463* (2013.01); *H01L 21/02024* (2013.01)

(58) Field of Classification Search
CPC ................................ B24B 37/044; C09G 1/02
USPC .......................................................... 51/309
See application file for complete search history.

(56) References Cited

U.S. PATENT DOCUMENTS

| | | | |
|---|---|---|---|
| 5,228,886 A | | 7/1993 | Zipperian |
| 5,804,513 A * | | 9/1998 | Sakatani et al. ............. 438/693 |
| 6,586,605 B1 * | | 7/2003 | Kahn ............................ 549/230 |
| 7,854,777 B2 | | 12/2010 | Takemiya et al. |
| 8,529,651 B2 | | 9/2013 | Lortz et al. |
| 2001/0049910 A1 | | 12/2001 | Kaufman et al. |
| 2001/0051746 A1 | | 12/2001 | Hagihara et al. |
| 2002/0017064 A1 | | 2/2002 | Shimazu et al. |
| 2002/0042208 A1 * | | 4/2002 | Beitel et al. .................... 438/745 |
| 2002/0168923 A1 | | 11/2002 | Kaufman et al. |
| 2003/0045097 A1 * | | 3/2003 | Retherford et al. .......... 438/689 |
| 2004/0194392 A1 | | 10/2004 | Takemiya et al. |
| 2006/0104881 A1 | | 5/2006 | Lortz et al. |
| 2006/0236922 A1 | | 10/2006 | Ishibashi et al. |
| 2007/0021040 A1 | | 1/2007 | Kawata et al. |
| 2007/0043124 A1 | | 2/2007 | Brandes et al. |
| 2007/0130839 A1 | | 6/2007 | Hagihara et al. |
| 2007/0149097 A1 * | | 6/2007 | Fujii et al. ....................... 451/41 |
| 2008/0138990 A1 | | 6/2008 | Nishioka et al. |
| 2008/0172951 A1 * | | 7/2008 | Starling ............... C09K 3/1436 51/308 |
| 2008/0283502 A1 | | 11/2008 | Moeggenborg et al. |
| 2009/0098807 A1 | | 4/2009 | Bakshi et al. |
| 2010/0092366 A1 * | | 4/2010 | Kogoi ................. B24B 37/0056 423/345 |
| 2011/0155951 A1 | | 6/2011 | Lortz et al. |
| 2013/0037515 A1 | | 2/2013 | Hosoi et al. |

FOREIGN PATENT DOCUMENTS

| | | |
|---|---|---|
| CN | 1572017 A | 1/2005 |
| CN | 1771192 A | 5/2006 |
| CN | 1780716 A | 5/2006 |
| CN | 101495271 A | 7/2009 |
| EP | 1 193 745 A1 | 4/2002 |
| EP | 1 432 645 A0 | 6/2004 |
| EP | 1 717 286 A1 | 11/2006 |
| JP | H05-001279 A | 1/1993 |
| JP | 05-156238 A | 6/1993 |
| JP | 2000-239652 A | 9/2000 |
| JP | 2002-012855 A | 1/2002 |
| JP | 2002-506915 A | 3/2002 |
| JP | 2005-117027 A | 4/2005 |
| JP | 2006-203188 A | 8/2006 |
| JP | 2008-044078 A | 2/2008 |
| JP | 4290799 B2 | 7/2009 |
| JP | 2010-284784 A | 12/2010 |
| WO | WO 99/47618 A1 | 9/1999 |
| WO | WO-03/031333 A2 | 4/2003 |
| WO | WO-2011/136387 A1 | 11/2011 |

* cited by examiner

Primary Examiner — Larry E Waggle, Jr.
Assistant Examiner — Henry Hong
(74) Attorney, Agent, or Firm — Foley & Lardner LLP

(57) ABSTRACT

Provided is a polishing composition containing at least aluminum oxide abrasive grains and water, and having a pH of 8.5 or higher. The aluminum oxide abrasive grains have a specific surface area of 20 $m^2/g$ or less. It is preferable for the aluminum oxide abrasive grains to have an average secondary particle size of 0.1 μm or more and 20 μm or less. The polishing composition is used for polishing hard and brittle materials having a Vickers hardness of 1,500 Hv or higher, such as sapphire, silicon carbide, and gallium nitride.

8 Claims, No Drawings

POLISHING COMPOSITION

TECHNICAL FIELD

The present invention relates to a polishing composition used for polishing an object to be polished composed of a hard and brittle material having a Vickers hardness of 1,500 Hv or higher. The present invention also relates to a method for polishing a hard and brittle material, and to a method for producing a substrate composed of a hard and brittle material.

BACKGROUND ART

A hard and brittle material means a brittle material with a high degree of hardness, and generally includes glasses, ceramics, stone materials, and semiconductor crystalline materials. Among hard and brittle materials, materials having a Vickers hardness of 1,500 Hv or higher, such as diamond, aluminum oxide (sapphire), silicon carbide, boron carbide, zirconium carbide, tungsten carbide, silicon nitride, titanium nitride, and gallium nitride, in general have a low reactivity due to their very high chemical stability, and also have a very high degree of hardness, and thus these materials are not readily-polishable. Therefore, these materials are usually finished through a diamond lapping process followed by polishing with colloidal silica to remove the scratches left by the lapping. In this case, however, a lengthy polishing is necessary to obtain a highly smooth surface.

Moreover, it has been known to polish sapphire substrates with a polishing composition containing a relatively high concentration of colloidal silica (see, for instance, Patent Document 1), and it has also been known to polish silicon carbide substrates with a polishing composition containing colloidal silica and having a specific pH (see, for instance, Patent Document 2). However, these cases have the problem that a sufficient polishing rate (removal rate) cannot be accomplished.

PRIOR ART DOCUMENTS

Patent Document 1: Japanese Laid-Open Patent Publication No. 2008-44078
Patent Document 2: Japanese Laid-Open Patent Publication No. 2005-117027

SUMMARY OF THE INVENTION

Problems that the Invention is to Solve

Accordingly, an objective of the present invention is to provide a polishing composition capable of polishing an object to be polished composed of a hard and brittle material having a Vickers hardness of 1,500 Hv or higher at a high polishing rate. Moreover, another objective of the present invention is to provide a method for polishing a hard and brittle material with the polishing composition and a method for producing a substrate composed of a hard and brittle material.

Means for Solving the Problems

The present inventors have conducted diligent studies to find out that the above objectives are achieved by using a polishing composition having a particular pH and containing aluminum oxide abrasive grains having a particular specific surface area. Selecting a particular type of aluminum oxide abrasive grains from among various types of abrasive grains and, at the same time, setting a specific surface area of aluminum oxide grains and a pH value of the polishing composition to respective predetermined ranges for the purpose of achieving the above objectives are not easily conceived even by those skilled in the art.

According to one aspect of the present invention, a polishing composition is provided that is used for polishing an object to be polished composed of a hard and brittle material having a Vickers hardness of 1,500 Hv or higher. The polishing composition contains at least aluminum oxide abrasive grains and water, and has a pH of 8.5 or higher. The aluminum oxide abrasive grains have a specific surface area of 20 $m^2/g$ or less.

It is preferable that the aluminum oxide abrasive grains have an average secondary particle size of 0.1 μm or more and 20 μm or less. Moreover, it is preferable that the object to be polished is a substrate or a film composed of sapphire, gallium nitride, or silicon carbide. Examples of the substrate to be polished include monocrystalline or polycrystalline substrates which are used for the production of devices, such as semiconductor devices, magnetic recording devices, optical devices, and power devices. The film to be polished may be formed on a substrate by the known film forming methods, such as an epitaxial growth.

According to another aspect of the present invention, a polishing method for polishing a hard and brittle material with the above polishing composition and a hard and brittle material production method including polishing a substrate by means of the polishing method.

Effects of the Invention

According to the present invention, a polishing composition capable of polishing an object to be polished composed of a hard and brittle material having a Vickers hardness of 1,500 Hv or higher at a high polishing rate is provided. Furthermore, a method for polishing a hard and brittle material with the polishing composition and a method for producing a substrate composed of a hard and brittle material are also provided.

MODE FOR CARRYING OUT THE INVENTION

Hereinafter, an embodiment of the present invention will be described.

A polishing composition according to the present embodiment contains at least aluminum oxide abrasive grains and water. The polishing composition is used for polishing an object to be polished composed of a hard and brittle material having a Vickers hardness of 1,500 Hv or higher, more specifically, the polishing composition is used for polishing an object to be polished composed of sapphire, silicon carbide, or gallium nitride. The Vickers hardness can be measured by the method prescribed in Japanese Industrial Standards JIS R1610 corresponding to ISO 14705 specified by International Organization for Standardization, and is calculated from the test force applied to a Vickers indenter with which an indentation on the surface of a test piece is formed and the surface area of the indentation determined by the diagonal length thereof.

The aluminum oxide abrasive grains contained in the polishing composition may be composed of, but are not limited to, for example, α-alumina, δ-alumina, θ-alumina, or κ-alumina. However, it is preferable that the aluminum oxide abrasive grains contain α-alumina as a main component in order to polish a hard and brittle material at a higher polishing rate. Specifically, the α-conversion rate of alumina in the aluminum oxide abrasive grains preferably 20% or more, and more preferably 40% or more. The α-conversion rate of alumina in the aluminum oxide abrasive grains is determined based on integrated intensity ratios of diffraction lines from the (113) plane obtained by an X-ray diffraction measurement.

The aluminum oxide abrasive grains may contain impurity elements, such as silicon, titanium, iron, copper, chromium, sodium, potassium, calcium, and magnesium. However, it is preferable that the purity of the aluminum oxide abrasive grains is as high as possible, specifically, preferably 99% by mass or higher, more preferably 99.5% by mass or higher, and even more preferably 99.8% by mass or higher. The impurity contamination of the surface of an object to be polished after polishing with the polishing composition decreases as the purity of the aluminum oxide abrasive grains become higher, provided that the purity of the aluminum oxide abrasive grains is 99% by mass or higher. In this regard, when the purity of the aluminum oxide abrasive grains is 99% by mass or higher, more specifically 99.5% by mass or higher, and even more specifically 99.8% by mass or higher, it becomes easier to reduce the impurity contamination of the surface of an object to be polished caused by the polishing composition to a particularly suitable level for practical use. The content of the impurity elements in the aluminum oxide abrasive grains can be calculated from a measured value with an ICP emission spectrophotometer, such as ICPE-9000 manufactured by Shimadzu Corporation.

The aluminum oxide abrasive grains have an average secondary particle size of preferably 0.1 μm or more, and more preferably 0.3 μm or more. The polishing rate of an object to be polished with the polishing composition increases as the average secondary particle size of the abrasive grains becomes larger.

The aluminum oxide abrasive grains have an average secondary particle size of preferably 20 μm or less, and more preferably 5 μm or less. It becomes easier to obtain a surface with fewer defects and lower degree of roughness by polishing with the polishing composition as the average secondary particle size of the abrasive grains becomes smaller. The average secondary particle size of the aluminum oxide abrasive grains is equal to a volume-weighted mean particle size measured with a laser diffraction/scattering particle size distribution analyzer, such as LA-950 manufactured by HORIBA, Ltd.

The aluminum oxide abrasive grains need to have a specific surface area of 20 $m^2/g$ or less. When the aluminum oxide abrasive grains having a specific surface area of more than 20 $m^2/g$ are used, a polishing composition capable of polishing an object to be polished at a high polishing rate cannot be obtained.

The aluminum oxide abrasive grains have a specific surface area of preferably 5 $m^2/g$ or more. It becomes easier to obtain a surface with fewer defects and lower degree of roughness by polishing with the polishing composition as the specific surface area of the abrasive grains becomes larger. The specific surface area of the aluminum oxide abrasive grains can be determined by means of a nitrogen adsorption method (BET method) with, for instance, Flow SorbII 2300 manufactured by Micromeritics Instrument Corporation.

The content of the aluminum oxide abrasive grains in the polishing composition is preferably 0.01% by mass or more, and more preferably 0.1% by mass or more. The polishing rate of an object to be polished with the polishing composition increases as the content of the abrasive grains increases.

Moreover, the content of the aluminum oxide abrasive grains in the polishing composition is preferably 50% by mass or less, and more preferably 40% by mass or less. It becomes easier to obtain a surface with fewer scratches by polishing with the polishing composition in addition to lowering the production costs of the polishing composition.

There is no specific limitation to a production process of the aluminum oxide abrasive grains. The aluminum oxide abrasive grains may be alumina which is obtained by refining bauxite by the Bayer method, or may be alumina obtained by grinding fused alumina thereof. Alternatively, the aluminum oxide abrasive grains may be aluminum oxide which is obtained through a heat process of aluminum hydroxide synthesized from an aluminum compound as a starting material by a hydrothermal synthesis method, or may be aluminum oxide which is synthesized from an aluminum compound by gas phase method. Aluminum oxides synthesized from an aluminum compound are characterized in that they have higher purity than usual aluminum oxides.

The polishing composition needs to have a pH of 8.5 or higher, and preferably 9.5 or higher. When the polishing composition has a pH of less than 8.5, polishing an object to be polished with the polishing composition at a sufficiently high polishing rate cannot be accomplished.

There is no specific limitation to the upper limit of the pH of the polishing composition. However, it is preferable that the pH of the polishing composition is 12 or lower. The polishing composition having a pH of 12 or lower has a high level of safety, and therefore it improves the operability at the time of use.

The pH of the polishing composition can be adjusted using a variety of acids, bases, or salts thereof. Specifically, preferably used are organic acids, such as a carboxylic acid, an organic phosphoric acid, and an organic sulfonic acid; inorganic acids, such as phosphoric acid, phosphorous acid, sulfuric acid, nitric acid, hydrochloric acid, boric acid, and carbonic acid; organic bases, such as tetramethylammonium hydroxide, trimethanolamine, and monoethanolamine; inorganic bases, such as potassium hydroxide, sodium hydroxide, and ammonia; or the salts thereof.

It is preferable to conduct a precision polishing after polishing with the polishing composition when a particularly high level of surface accuracy is required for substrates for semiconductors, optical devices, and power devices.

According to the embodiment of the present invention, the advantage described below is provided.

The polishing composition according to the present embodiment contains at least aluminum oxide abrasive grains and water, and has a pH of 8.5 or higher. The aluminum oxide abrasive grains have a specific surface area of 20 $m^2/g$ or less. According to the polishing composition, an object to be polished composed of a hard and brittle material having a Vickers hardness of 1,500 Hv or higher can be polished at a high polishing rate.

The above embodiment may be modified as follows.

The polishing composition of the above embodiment may further contain abrasive grains other than aluminum oxide which are composed of, for example, silicon dioxide, zirconium oxide, cerium oxide, titanium oxide, silicon carbide, or aluminum hydroxide.

The polishing composition of the above embodiment may optionally further contain additives, such as an oxidizing agent, a complexing agent, and an etchant, having an effect of increasing the polishing rate.

The polishing composition of the above embodiment may optionally further contain known additives such as an antiseptic agent, an antifungal agent, and a rust inhibitor.

The polishing composition of the above embodiment may optionally further contain additives such as dispersants for improving dispersibility of the abrasive grains or dispersing aids for facilitating redisperse agglomerations of the abrasive grains.

The polishing composition having been used for polishing an object to be polished composed of a hard and brittle material may be recovered and reused (cycle usage). Specifically, the used polishing composition having been discharged from the polishing machine may be once recovered into a tank, and then supplied again to the polishing machine from the tank. In this case, it becomes possible to reduce the impact on the environment and to cut costs since it lessens the need for disposing the used polishing composition as a waste.

When the polishing composition is used in a cycle usage, at least any of the components in the polishing composition, such as the aluminum oxide abrasive grains, having been reduced in the amount through consumption or loss during the use in polishing may be replenished. The component to be replenished may be individually added to the used polishing composition, or the mixture containing two or more components in any concentrations may be added to used polishing composition.

The polishing composition of the above embodiment may be prepared by diluting an undiluted polishing composition with water.

The polishing composition of the above embodiment may be of a one-component type; or may be of a multi-component type, such as a two-component type, composed of a plurality of compositions which are mixed all together at the time of use. In the case of two-component type polishing composition, the first and the second compositions may be supplied from a different path respectively to the polishing machine in such a way that the two compositions are mixed on the polishing machine.

Next, the present invention will be described with reference to examples and comparative examples.

Examples 1 to 5 and Comparative Examples 1 to 5

The polishing compositions of Examples 1 to 5 and Comparative Examples 1 to 5 were prepared by diluting aluminum oxide sol, silicon oxide sol, or zirconium oxide sol with water and then adding a pH adjusting agent to the resultant when needed. The content of the abrasive grains in every polishing composition of Examples 1 to 5 and Comparative examples 1 to 5 was 20% by mass. Hydrochloric acid and potassium hydroxide were used as a pH adjusting agent as needed. The surface of a sapphire substrate (C plane (<0001>) was polished on the conditions shown in Table 1 with each polishing composition. The sapphire substrates used here were all the same type with a diameter of 52 mm (about 2 inches).

Details of the abrasive grains contained in each polishing composition and the pH of each polishing composition are as shown in Table 2. Moreover, the polishing rate was determined by the calculation based on the difference of the weight of the sapphire substrate measured before and after polishing with each polishing composition, and the results are shown in the column entitled "Polishing rate" in Table 2.

TABLE 1

<Polishing conditions of sapphire substrate>

| | |
|---|---|
| Polishing machine: | single-sided polishing machine "EJ-380IN" manufactured by Engis Japan Corporation (Diameter of platen 380 mm) |
| Polishing pad: | non-woven polishing pad "SUBA800" manufactured by Nitta Haas Incorporated |
| Polishing load: | 300 g/cm$^2$ (29.4 kPa) |
| Rotational speed of platen: | 60 rpm |
| Linear velocity: | 72 m/min |
| Polishing time: | 5 minutes |
| Feed rate of polishing composition: | 280 mL/min (Non-cycle Usage) |

TABLE 2

| | Type of abrasive grains | Specific surface area of abrasive grains [m$^2$/g] | Average secondary particle size of abrasive grains [μm] | pH of polishing composition | Polishing rate [nm/min] |
|---|---|---|---|---|---|
| Example 1 | Aluminum oxide | 12 | 0.43 | 12.0 | 70 |
| Example 2 | Aluminum oxide | 12 | 0.43 | 11.0 | 68 |
| Example 3 | Aluminum oxide | 12 | 0.43 | 10.0 | 67 |
| Example 4 | Aluminum oxide | 12 | 0.43 | 9.0 | 52 |
| Example 5 | Aluminum oxide | 12 | 0.43 | 8.5 | 43 |
| Comparative Example 1 | Aluminum oxide | 26 | 0.15 | 10.0 | 10 |
| Comparative Example 2 | Aluminum oxide | 12 | 0.43 | 7.0 | 33 |
| Comparative Example 3 | Aluminum oxide | 12 | 0.43 | 6.0 | 32 |
| Comparative Example 4 | Silicon oxide | 34 | 0.05 | 10.0 | 22 |
| Comparative Example 5 | Zirconium oxide | 23 | 1.38 | 10.0 | 2 |

As shown in Table 2, when the sapphire substrates were polished with the polishing compositions of Examples 1 to 5, higher polishing rates were obtained compared with those obtained in the case when the polishing compositions of Comparative Examples 1 to 5 were used.

Examples 6 to 8 and Comparative Example 6

The polishing compositions of Examples 6 to 8 and Comparative Example 6 were prepared by diluting aluminum oxide sol with water and then adding a pH adjusting agent to the resultant when needed. The content of the abrasive grains in every polishing composition of Examples 6 to 8 and Comparative Example 6 was 20% by mass. Hydrochloric acid and potassium hydroxide were used as a pH adjusting agent as needed. The surface of a gallium nitride substrate (Ca plane) was polished on the conditions shown in Table 3 with each polishing composition. The gallium nitride substrates used here were all the same type with a 10 mm square shape.

Details of the abrasive grains contained in each polishing composition and the pH of each polishing composition are as shown in Table 4. Moreover, the polishing rate was determined by the calculation based on the difference of the weight of the gallium nitride substrate measured before and after polishing with each polishing composition, and the results are shown in the column entitled "Polishing rate" in Table 4.

TABLE 3

<Polishing conditions of gallium nitride substrate>

| | |
|---|---|
| Polishing machine: | single-sided polishing machine "AL-2" manufactured by Udagawa Optical Machines Co., Ltd. (Diameter of platen 300 mm) |
| Polishing pad: | suede pad "SURFIN SSW-1" manufactured by Fujimi Incorporated |
| Polishing load: | 700 g/cm$^2$ (68.6 kPa) |
| Rotational speed of platen: | 130 rpm |
| Linear velocity: | 75 m/min |
| Polishing time: | 60 minutes |
| Feed rate of polishing composition: | 10 mL/min (Cycle Usage) |

TABLE 4

| | Type of abrasive grains | Specific surface area of abrasive grains [m$^2$/g] | Average secondary particle size of abrasive grains [μm] | pH of polishing composition | Polishing rate [nm/min] |
|---|---|---|---|---|---|
| Example 6 | Aluminum oxide | 12 | 0.43 | 12.0 | 27 |
| Example 7 | Aluminum oxide | 12 | 0.43 | 11.0 | 26 |
| Example 8 | Aluminum oxide | 12 | 0.43 | 9.0 | 25 |
| Comparative Example 6 | Aluminum oxide | 12 | 0.43 | 3.0 | 13 |

As shown in Table 4, when the gallium nitride substrates were polished with the polishing compositions of Examples 6 to 8, higher polishing rates were obtained compared with the polishing rate obtained in the case when the polishing composition of Comparative Examples 6 was used.

INDUSTRIAL APPLICABILITY

According to the present invention, substrates, films and the like with fewer surface defects and excellent surface accuracy can be obtained with high efficiency in polishing hard and brittle materials, such as sapphire, silicon nitride, and silicon carbide.

The invention claimed is:

1. A polishing composition used for polishing a hard and brittle material having a Vickers hardness of 1,500 Hv or higher, consisting of aluminum oxide abrasive grains and water, wherein the polishing composition has a pH of 8.5 or higher, wherein the aluminum oxide abrasive grains have a specific surface area of 20 m$^2$/g or less, and wherein the aluminum oxide abrasive grains have an average secondary particle size of 0.43 μm or more and 5 μm or less.

2. A polishing method comprising:
providing a hard and brittle material having a Vickers hardness of 1,500 Hv or higher; and
polishing the hard and brittle material with the polishing composition according to claim 1.

3. The polishing method according to claim 2, wherein the hard and brittle material is sapphire, silicon carbide, or gallium nitride.

4. A method for producing a polished substrate composed of a hard and brittle material, comprising:
providing a substrate composed of a hard and brittle material having a Vickers hardness of 1,500 Hv or higher; and
polishing the substrate with the polishing composition according to claim 1.

5. The method according to claim 4, wherein the hard and brittle material is sapphire, silicon carbide, or gallium nitride.

6. A polishing composition used for polishing a hard and brittle material having a Vickers hardness of 1,500 Hv or higher, consisting of aluminum oxide abrasive grains, water, and at least one selected from the group consisting of a pH adjusting agent, oxidizing agent, a complexing agent, an etchant, an antiseptic agent, an antifungal agent, a rust inhibitor, a dispersant, and a dispersing aid, wherein the polishing composition has a pH of 8.5 or higher, wherein the aluminum oxide abrasive grains have a specific surface area of 20 m$^2$/g or less, and wherein the aluminum oxide abrasive grains have an average secondary particle size of 0.43 μm or more and 5 μm or less.

7. A polishing method comprising:
providing a hard and brittle material having a Vickers hardness of 1,500 Hv or higher; and
polishing the hard and brittle material with the polishing composition according to claim 6.

8. A method for producing a polished substrate composed of a hard and brittle material, comprising:
providing a substrate composed of a hard and brittle material having a Vickers hardness of 1,500 Hv or higher; and
polishing the substrate with the polishing composition according to claim 6.

* * * * *